United States Patent
Kurita et al.

(10) Patent No.: US 10,032,758 B2
(45) Date of Patent: Jul. 24, 2018

(54) METHOD OF MANUFACTURING SEMICONDUCTOR DEVICE

(71) Applicant: KABUSHIKI KAISHA TOSHIBA, Tokyo (JP)

(72) Inventors: Yoichiro Kurita, Tokyo (JP); Hideto Furuyama, Kanagawa (JP); Hiroshi Uemura, Kanagawa (JP); Fumitaka Ishibashi, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/257,433

(22) Filed: Sep. 6, 2016

(65) Prior Publication Data

US 2017/0263595 A1    Sep. 14, 2017

(30) Foreign Application Priority Data

Mar. 14, 2016    (JP) ................... 2016-050211

(51) Int. Cl.
*H01L 25/16*    (2006.01)
*H01L 23/00*    (2006.01)

(52) U.S. Cl.
CPC ............ *H01L 25/167* (2013.01); *H01L 24/32* (2013.01); *H01L 24/83* (2013.01); *H01L 24/94* (2013.01); *H01L 24/96* (2013.01); *H01L 2224/27502* (2013.01); *H01L 2224/29186* (2013.01); *H01L 2224/32145* (2013.01); *H01L 2224/83009* (2013.01); *H01L 2224/83203* (2013.01); *H01L 2224/83359* (2013.01); *H01L 2224/83379* (2013.01); *H01L 2224/83896* (2013.01); *H01L 2924/1032* (2013.01); *H01L 2924/10253* (2013.01)

(58) Field of Classification Search
CPC ....... H01L 2924/01078; H01L 2924/14; H01L 2924/01029; H01L 2924/01013; H01L 25/167
USPC .................................... 438/110, 113
See application file for complete search history.

(56) References Cited

U.S. PATENT DOCUMENTS

| | | | |
|---|---|---|---|
| 6,836,579 B2 | 12/2004 | Ouchi | |
| 6,970,612 B2 | 11/2005 | Ouchi | |
| 7,153,361 B2 | 12/2006 | Furuyama | |
| 7,435,998 B2 | 10/2008 | Kondo | |
| 7,709,283 B2 | 5/2010 | Kondo | |
| 8,790,944 B2 * | 7/2014 | Akagi | H01L 33/0095 438/45 |

FOREIGN PATENT DOCUMENTS

| | | |
|---|---|---|
| JP | 2950106 B2 | 9/1999 |
| JP | 3812500 B2 | 8/2006 |
| JP | 3990846 B2 | 10/2007 |

* cited by examiner

*Primary Examiner* — Quoc Hoang
(74) *Attorney, Agent, or Firm* — Foley & Lardner LLP

(57) ABSTRACT

According to one embodiment, at first, a compound semiconductor layer is bonded to a position straddling a plurality of chip formation regions arranged on a substrate. One of the chip formation regions has a first size, and the compound semiconductor layer has a second size smaller than the first size. Thereafter, the compound semiconductor layer is processed to provide compound semiconductor elements on the chip formation regions. Then, the substrate is divided to correspond to the chip formation regions.

15 Claims, 8 Drawing Sheets

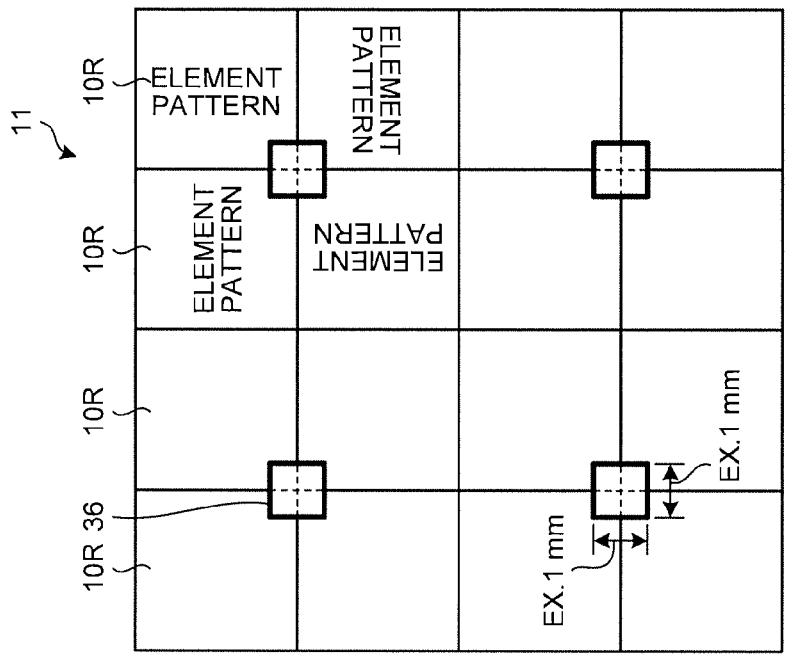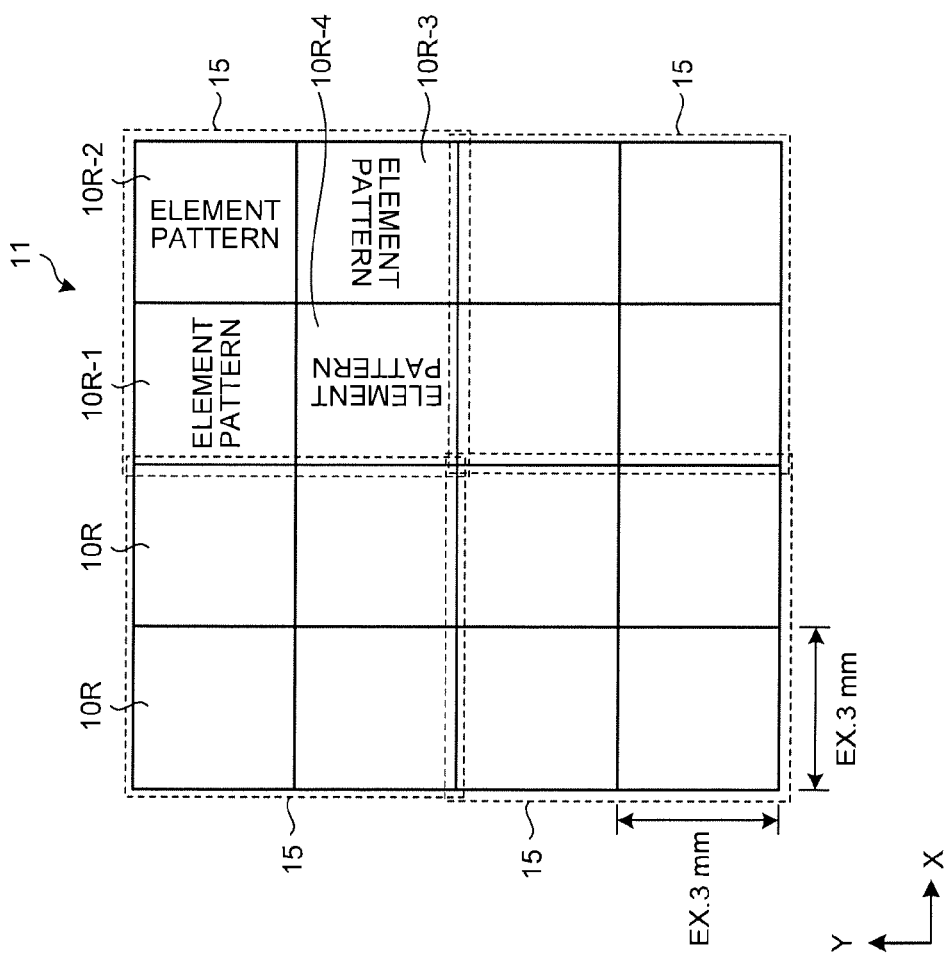

FIG.8A    FIG.8B
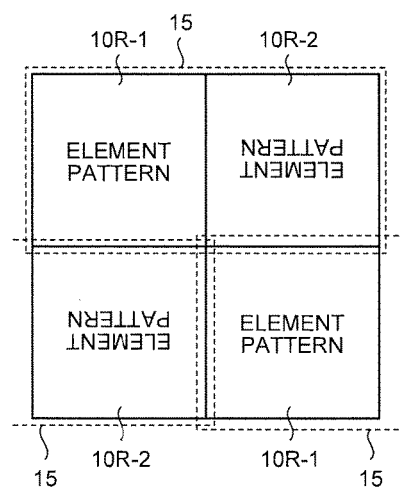 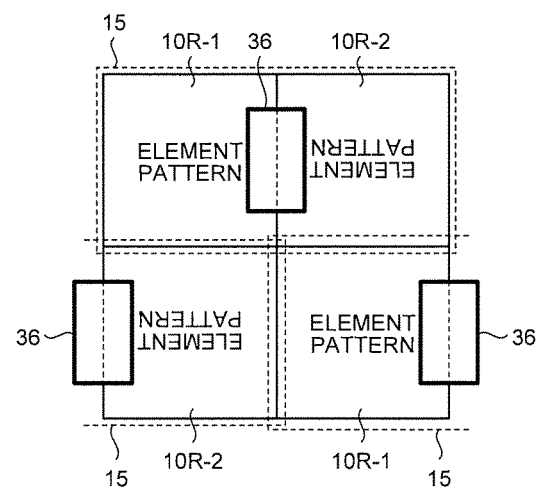
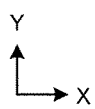

METHOD OF MANUFACTURING SEMICONDUCTOR DEVICE

CROSS-REFERENCE TO RELATED APPLICATIONS

This application is based upon and claims the benefit of priority from Japanese Patent Application No. 2016-050211, filed on Mar. 14, 2016; the entire contents of which are incorporated herein by reference.

FIELD

Embodiments described herein relate generally to a semiconductor device and a method of manufacturing a semiconductor device.

BACKGROUND

Research and development have been actively performed for a technique called "Silicon Photonics", in which optical elements, such as light emitting/light receiving elements, a waveguide, and a demultiplexer, are formed on a silicon chip equipped with a CMOS (Complementary Metal-Oxide-Semiconductor) circuit or the like. Particularly, such a form that a laser light source and so forth made of a group III-V compound semiconductor material are integrated on silicon (which will be referred to as "III-V/Si", hereinafter) can become an important technique, depending on the future development of Silicon Photonics. Further, as other applications of the III-V/Si, there can be considered an application to a ultra high speed electronics field in which a ultra high speed transistor made of a group III-V compound semiconductor is combined with a silicon CMOS, and an application to a structure in which a sensor and an actuator formed as group III-V compound semiconductor devices are integrated on a signal processing circuit made of silicon.

BRIEF DESCRIPTION OF THE DRAWINGS

FIGS. 3A and 3B are top views showing the example of the sequence of a method of manufacturing a semiconductor device according to the first embodiment;

FIGS. 8A and 8B are top views showing part of the sequence of a method of manufacturing a semiconductor device according to the second embodiment.

DETAILED DESCRIPTION

In general, according to one embodiment, at first, a compound semiconductor layer is bonded to a position straddling a plurality of chip formation regions arranged on a substrate. One of the chip formation regions has a first size, and the compound semiconductor layer has a second size smaller than the first size. Thereafter, the compound semiconductor layer is processed to provide compound semiconductor elements on the chip formation regions. Then, the substrate is divided to correspond to the chip formation regions.

Conventionally, for example, the III-V/Si is manufactured as follows. At first, CMOS circuits or the like are respectively formed in chip formation regions each having a first size on a silicon substrate. Thereafter, group III-V compound semiconductor chips diced in a second size smaller than the first size are respectively transferred onto chip formation regions on the silicon substrate. Thereafter, the group III-V compound semiconductor chips are processed on the silicon substrate, and thereby the device is formed. As a final step, the silicon substrate is diced in the first size, so that a group III-V compound semiconductor device is obtained in a state formed on a silicon chip having the first size.

However, in the conventional technique described above, there is a problem in which, if the size of the necessary device made of a group III-V compound semiconductor material, i.e., the group III-V compound semiconductor chip, is formed smaller, it becomes difficult to bond the chip to each of the chip formation regions on the silicon substrate.

Exemplary embodiments of a semiconductor device and a method of manufacturing a semiconductor device will be explained below in detail with reference to the accompanying drawings. The present invention is not limited to the following embodiments. The sectional views of a semiconductor device used in the following embodiments are schematic, and so the relationship between the thickness and width of each layer and/or the thickness ratios between respective layers may be different from actual states. Further, the size of each chip described below is a mere example and is not limiting.

First Embodiment

Figure 1A:
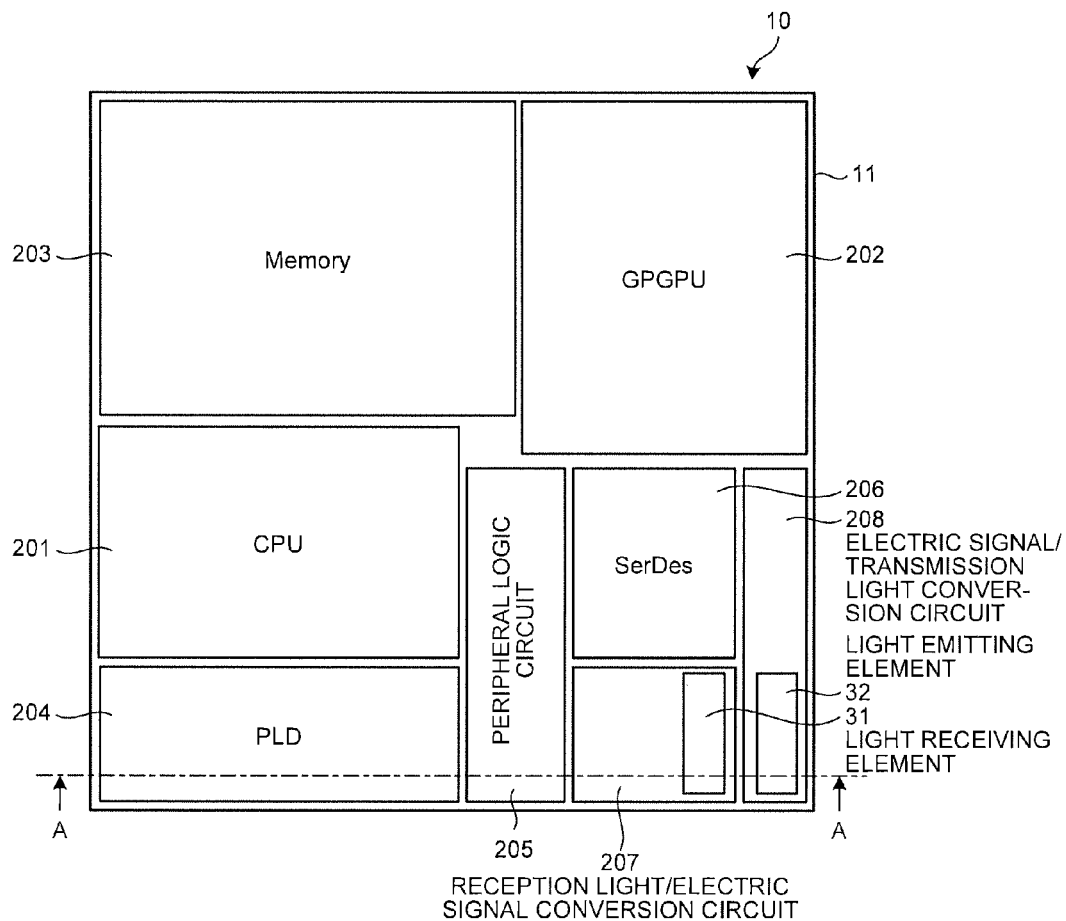
FIGS. 1A and 1B are views schematically showing a structural example of a semiconductor device according to a first embodiment.
Figure 1B:
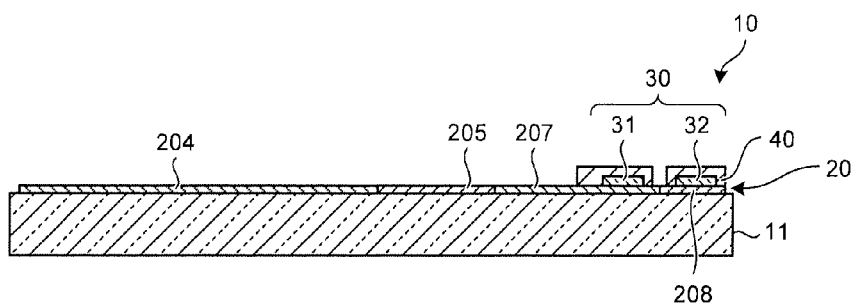

FIGS. 1A and 1B are views schematically showing a structural example of a semiconductor device according to a first embodiment. FIG. 1A is a top view, and FIG. 1B is a sectional view taken along a line A-A of FIG. 1A. This semiconductor device formed of a semiconductor chip 10 has a configuration in which a first structure 20, optical function elements 30, and second structures 40 are arranged on a substrate 11 having a square shape.

As the substrate 11, a silicon substrate or SOI (Silicon-On-Insulator) substrate may be used. If such a substrate, particularly the SOI substrate, is used, it becomes easier to fabricate not only an electric circuit formed of, e.g., a transistor and wiring lines, but also an optical function element, such as a waveguide, on the substrate 11.

The first structure 20 includes function blocks composed of circuit elements, optical function elements, or wiring structures connected to these elements, which are arranged on the substrate 11 or in the substrate 11, and the upper surface of the first structure 20 is in a planarized state. The circuit element may be exemplified by a CMOS circuit or the like. The optical function element may be exemplified by a waveguide or the like. Each of the circuit element and the optical function element is made of a semiconductor material, such as silicon, a conductive material, such as copper or aluminum, and an insulator material, such as a silicon oxide film or silicon nitride film.

The function block is formed of an element pattern which is composed of a circuit element or optical function element and a wiring structure so that the element pattern can have a predetermined function. In the example shown in FIG. 1A, the function blocks arranged here are a CPU (Central Processing Unit) 201, a GPGPU (General-Purpose computing on Graphics Processing Units) 202, a memory 203, a PLD (Programmable Logic Device) 204, a peripheral logic circuit 205, a SerDes (Serializer/Deserializer) 206, a reception light/electric signal conversion circuit 207, and an electric signal/transmission light conversion circuit 208.

In the first structure 20, there is a case where various device elements and wiring structures having different heights are arranged and so the upper surface of the first structure 20 has different levels depending on the position. In this case, the upper surface is planarized by a planarization film (not shown). As the planarization film, a silicon oxide film or the like may be used. The upper surface of the first structure 20 is preferably has a root mean square roughness (which will be referred to as "RMS", hereinafter) of 0 nm or more and 3 nm or less. If the RMS is larger 3 nm, the bonding of the optical function element 30 onto the upper surface, which will be described later with reference to a manufacturing method, may become unable to be performed in a good state. The planarized upper surface of the first structure 20 is made of silicon or silicon oxide. On the upper surface of the first structure 20, different materials may be exposed, depending on the position. Further, a material exposed on the upper surface of the first structure 20 may be different from a material present under the exposed material.

The optical function element 30 may be exemplified by a light receiving element 31 or light emitting element 32. The light receiving element 31 is bonded on the reception light/electric signal conversion circuit 207. The light emitting element 32 is formed on the electric signal/transmission light conversion circuit 208. As the light emitting element 32, for example, a laser diode may be used. The optical function element 30 is made of a group III-V compound semiconductor, such as InP, GaAs, GaP, or InAs. The optical function element 30 is bonded onto the first structure 20 by means of oxide film bonding or adhesive bonding.

The second structure 40 is a structure arranged on the first structure 20 provided with the optical function element 30. For example, the second structure 40 is a wiring structure that connects the optical function element 30 to another device element built in the first structure 20.

When the semiconductor chip 10 is in operation, each of the CPU 201 and the GPGPU 202 shows a heat release value far larger than the other function blocks. On the other hand, the optical function element 30 can be easily affected by heat. Accordingly, the optical function element 30 is preferably arranged at a position distant as possible from a function block having a large heat release value so that the optical function element 30 will be less affected by the thermal influence of the function block having a large heat release value.

In consideration of the matter described above, according to the first embodiment, the optical function element 30 is arranged near a corner of the substrate 11 having a square shape. The arrangement position of the optical function element 30 is preferably set at a position most distant from the center of the substrate 11. Alternatively, the optical function element 30 is arranged such that no function block is present in a region opposite to that side where the function block having a large heat release value is arranged with respect to the arrangement position of the optical function element 30, i.e., in a region outside the arrangement position of the optical function element 30. However, a device element, such as a wiring line, which does not have a special function may be arranged in a region between the arrangement position of the optical function element 30 and an end portion of the substrate 11 closest to the arrangement position of the optical function element 30.

The arrangement position of the optical function element 30 is set as described above, and thereby the optical function element 30 can be less affected by the thermal influence of a circuit element having a large heat release value.

It should be noted that FIG. 1A illustrates the light receiving element 31 and the light emitting element 32 as examples of the optical function element 30, but a modulator, demultiplexer, or waveguide may be provided as the optical function element 30.

Next, an explanation will be given of a method of manufacturing a semiconductor device of this type. FIGS. 2A to 2H are sectional views showing an example of the sequence of a method of manufacturing a semiconductor device according to the first embodiment. FIGS. 3A and 3B are top views showing the example of the sequence of a method of manufacturing a semiconductor device according to the first embodiment.

Figure 2A:
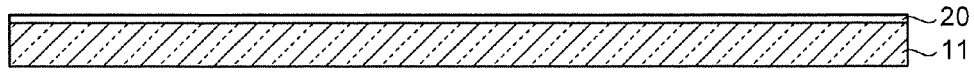
FIGS. 2A to 2H are sectional views showing an example of the sequence of a method of manufacturing a semiconductor device according to the first embodiment.

At first, as shown in FIGS. 2A and 3A, first structures 20 respectively having predetermined element patterns are formed over respective chip formation regions 10R of a substrate 11, such as a silicon substrate, and the upper surfaces of the first structures 20 are planarized. The element patterns may be exemplified by a circuit element, such as a CMOS circuit, an optical function element, such as a waveguide, and a wiring line connected to the circuit element or optical function element. Further, the length of one side of each of the chip formation regions 10R is set to 3 mm.

The element patterns are formed by use of ordinary semiconductor manufacturing processes. For example, a processing object film (not shown) for constituting the element patterns is formed on the substrate 11 by use of a film formation method, such as a CVD (Chemical Vapor Deposition) method or PVD (Physical Vapor Deposition) method. Thereafter, a resist (not shown) is applied onto the processing object film, and resist patterns for forming the element patterns are formed by use of a lithography technique. At this time, the square chip formation regions 10R to be chips later are formed on the substrate 11, and the resist patterns are respectively formed in the chip formation regions 10R. In the first embodiment, the resist patterns are formed such that four chip formation regions 10R sharing one corner part are treated as one chip sharing unit 15 and this chip sharing unit 15 is repeatedly arranged in a two-dimensional state as shown in FIG. 3A.

In the single chip sharing unit 15, the chip formation regions 10R are arranged to be four-fold rotational symmetric. Specifically, the resist pattern arrangements of the respective chip formation regions 10R rotated by 90° about the center of the chip sharing unit 15 overlap with the resist pattern arrangements of the respective chip formation regions 10R not rotated.

As shown in FIG. 3A, an X-axis and a Y-axis are defined on the substrate 11. It is assumed that, in the single chip sharing unit 15, the region arranged on the X-axis negative side and the Y-axis positive side is a first chip formation region 10R-1, the region arranged on the X-axis positive side and the Y-axis positive side is a second chip formation region 10R-2, the region arranged on the X-axis positive side and the Y-axis negative side is a third chip formation region 10R-3, and the region arranged on the X-axis negative side and the Y-axis negative side is a fourth chip formation region 10R-4. On this assumption, the resist pattern formed in the first chip formation region 10R-1 is the same as that of the fourth chip formation region 10R-4 rotated clockwise by 90°, the resist pattern formed in the second chip formation region 10R-2 is the same as that of the first chip formation region 10R-1 rotated clockwise by 90°, the resist pattern formed in the third chip formation region 10R-3 is the same as that of the second chip formation region 10R-2 rotated clockwise by 90°, and the resist pattern formed in the fourth chip formation region 10R-4 is the same as that of the third chip formation region 10R-3 rotated clockwise by 90°.

In order to form the resist patterns in a layer of these chip formation regions 10R, a mask (reticle) of only one type is required. In this case, when a light exposure process is performed, at least one of the mask and the substrate 11 is rotated so that the resist pattern of each of the chip formation regions 10R can be formed. Alternatively, masks of four types may be prepared such that they have patterns the same in shape and different in orientation by 90°, or a mask of one type may be prepared such that it can be used to perform light exposure to the entire single chip sharing unit 15 at a time.

Thereafter, steps, such as film formation and etching, are repeated, so that the element patterns are formed in the respective chip formation regions 10R. Then, a planarization film is formed on the substrate 11 including the element patterns, and the uppermost surface of the substrate 11, i.e., the upper surface of the planarization film, is planarized, by use of a CMP (Chemical Mechanical Polishing) method. Consequently, the first structures 20 are formed. At this time, the planarization may be performed to expose the upper surfaces of part of the element patterns, or to cover the entirety of the element patterns with the planarization film. Here, the planarization only needs to set the upper surfaces of the first structures 20 to have an RMS of 3 nm or less. As the planarization film, for example, a silicon oxide film may be used.

Figure 2B:

On the other hand, in addition to the formation of the element patterns onto the substrate 11 shown in FIG. 2A; as shown in FIG. 2B, a group III-V compound semiconductor layer (which will be referred to as "compound semiconductor layer", hereinafter) 37 is formed by use of epitaxial growth over respective chip formation regions of a group III-V compound semiconductor substrate (which will be referred to as "compound semiconductor substrate", hereinafter) 35. As the compound semiconductor substrate 35 and the compound semiconductor layer 37, InP, GaAs, GaP, or InAs may be used. The type and thickness of a film for forming the compound semiconductor layer 37 may be changed, depending on the optical function element 30 to be processed later. For example, in a case where a light emitting element is to be formed, the compound semiconductor layer 37 may be used in a state having a structure in which a quantum well layer is sandwiched by clad layers formed on its upper and lower surfaces.

Figure 2C:
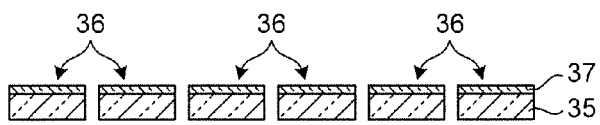

Then, as shown in FIG. 2C, the compound semiconductor substrate 35 formed with the compound semiconductor layer 37 is diced along dicing lines, and thereby it is divided into a plurality of compound semiconductor chips 36. Each of the compound semiconductor chips 36 has a size of 1 mm square, for example.

Figure 2D:
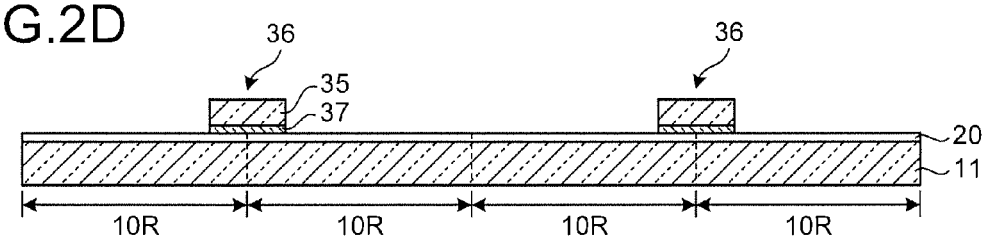

Thereafter, as shown in FIGS. 2D and 3B, the compound semiconductor chips 36 are placed such that their surfaces each including the compound semiconductor layer 37 formed thereon face the first structures 20 on the substrate 11. Here, each of the compound semiconductor chips 36 is positioned such that its center is aligned with the center of each of the chip sharing units 15 of the substrate 11, and then the compound semiconductor chips 36 and the first structures 20 are bonded. Consequently, each of the compound semiconductor chips 36 is placed at the corner part shared by the four chip formation regions 10R constituting each of the chip sharing units 15.

As the bonding of the compound semiconductor chips 36 to the first structures 20, adhesive bonding or oxide film bonding may be used. In the case of the adhesive bonding, the compound semiconductor chips 36 and the first structures 20 are bonded to each other via a resin, such as BCB (Benzocyclobutene).

In the case of the oxide film bonding, the compound semiconductor chips 36 and the first structures 20 are bonded to each other by use of a hydroxyl group formed on their surfaces. More specifically, the upper surfaces of the first structures 20 and the surfaces of the compound semiconductor chips 36 each including the compound semiconductor layer 37 formed thereon are terminated with a hydroxyl group. For example, the upper surfaces of the first structures 20 and the upper surfaces of the compound semiconductor layers 37 are irradiated with plasma, and thereby the respective surfaces are activated. Consequently, contaminants, such as organic matters, deposited on the respective surfaces are removed, and the surfaces are terminated with a hydroxyl group. Here, water molecules can be easily coupled by hydrogen bonds with the surfaces terminated with the hydroxyl group.

Then, the activated surfaces of the compound semiconductor chips 36 are brought into close contact with the activated upper surfaces of the first structures 20. Consequently, the compound semiconductor chips 36 are temporarily bonded to the first structures 20. At this time, between the activated surfaces of the compound semiconductor chips 36 and the activated surfaces of the first structures 20, water molecules coupled with the hydroxyl group are connected to each other, and thereby the activated surfaces are temporarily bonded to each other.

Thereafter, a pressure is physically applied to at least one of the rear side of the compound semiconductor chips 36 and the rear side of the substrate 11, and, in this state, they are heated to a temperature of about 200° C., for example. Consequently, the water molecules are removed from the interface of bonding between the first structures 20 and the compound semiconductor layers 37, and thereby the bonding is turned into covalent bonding formed by oxygen atoms, which is final bonding originally aimed. In this respect, silicon and group III-V compound semiconductor have different thermal expansion coefficients. Accordingly, if the heating temperature is set higher than 250° C., a residual thermal stress may be generated by a thermal effect after the bonding process ends, and/or a damage may be caused to the structure inside the compound semiconductor layer. In order to suppress these problems, the heating temperature is preferably set to 250° C. or less.

Further, as a method of bonding the compound semiconductor chips 36 to the first structures 20, there is a pick and place method or a method of using an adhesive sheet. In the case of the pick and place method, each of the compound semiconductor chips 36 is held by a flip chip bonder and placed at the center of each of the chip sharing units 15 of the substrate 11.

In the case of the method of using the adhesive sheet, at first, the adhesive sheet (dicing tape) is stuck to the rear side of the compound semiconductor substrate 35 before the dicing shown in FIG. 2C, and then the compound semiconductor substrate 35 is diced into a plurality of compound semiconductor chips 36 without cutting the adhesive sheet. Thereafter, the adhesive sheet is stretched and expanded toward the periphery. Consequently, the gap between adjacent compound semiconductor chips 36 is made wider. At this time, the distance between the centers of adjacent compound semiconductor chips 36 is set to be equal to the distance between the centers of adjacent chip sharing units 15 of the substrate 11. Thereafter, the plurality of compound semiconductor chips 36, which are stuck on the adhesive sheet, are positioned with respect to the substrate 11, and then the plurality of compound semiconductor chips 36 on the adhesive sheet are bonded to the first structures 20.

Figure 2E:
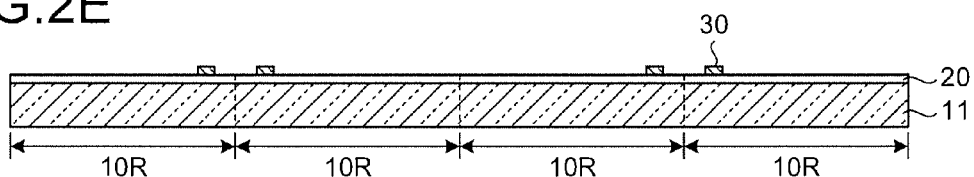

Then, as shown in FIG. 2E, the compound semiconductor substrate 35 is removed from the compound semiconductor chips 36. As the removing method, mechanical grinding, dry etching, wet etching, or a method of using a combination of them may be selected. Consequently, only the compound semiconductor layers 37 are left on the first structures 20. Further, the compound semiconductor layers 37 are processed by use of a lithography technique and an etching technique, and thereby optical function elements 30, such as a light emitting element and/or a light receiving element, are respectively formed in the chip formation regions 10R that constitute each of the single chip sharing units 15. Each of the optical function elements 30 formed at this time has a size of 0.5 mm square or less. For example, if the optical function element 30 is to be utilized for a laser light source, a size of about 0.3 to 0.5 mm is enough to oscillate laser.

Figure 2F:
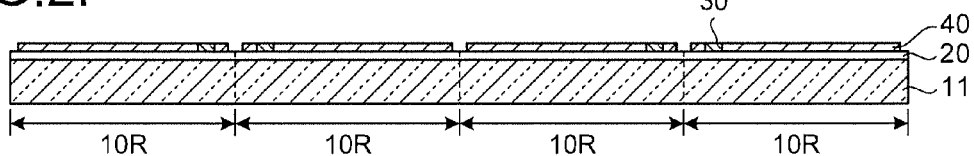

Thereafter, as shown in FIG. 2F, second structures 40 are formed on the substrate 11 formed with the optical function elements 30. For example, the second structure 40 may be exemplified by an electrode layer that connects an optical function element 30 to a device element of the corresponding first structure 20 and an interlayer insulating film that covers the electrode layer.

Figure 2G:
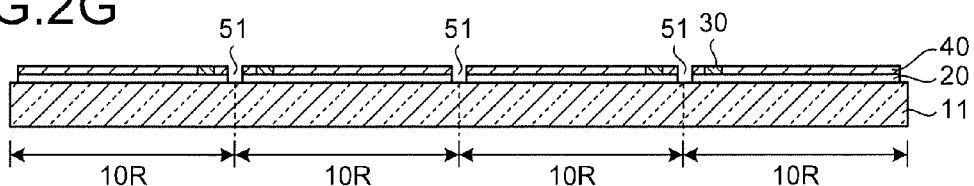
Figure 2H:
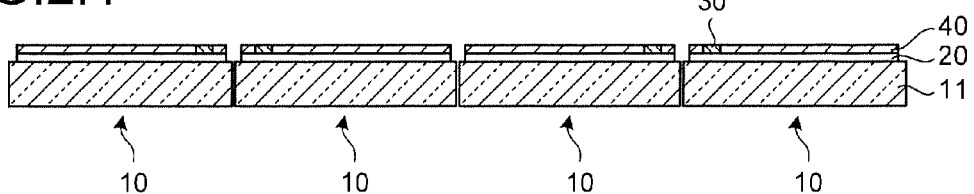

Then, as shown in FIG. 2G, grooves 51 for demarcating the first structures 20 respectively into the chip formation regions 10R are formed by use of a lithography technique and an etching technique. Then, as shown in FIG. 2H, the substrate 11 is diced along dicing lines. Consequently, semiconductor chips 10 are separated. Thus, each of the semiconductor chips 10 is obtained together with an optical function element 30 bonded thereto, and so the process of manufacturing a semiconductor device ends.

In the explanation described above, FIGS. 2D and 3B show an example in which each of the compound semiconductor chips 36 is bonded to a region including the center of the chip sharing unit 15 composed of four chip formation regions 10R, but this embodiment is not limited to this example. Further, in the explanation described above, the compound semiconductor substrate 35 including the epitaxial growth compound semiconductor layer 37 is divided into chips, and the chips each including the compound semiconductor layer 37 are bonded to the substrate 11 made of silicon or the like, but this embodiment is not limited to this example. For example, this embodiment covers a case where, after the compound semiconductor layer 37 is formed by use of epitaxial growth on the compound semiconductor substrate 35, only a partly diced compound semiconductor layer 37 is picked up therefrom by lifting off a separation object portion by use of laser or chemical solvent, and then this compound semiconductor layer 37 is bonded to the substrate 11 made of silicon or the like.

Figure 4A:
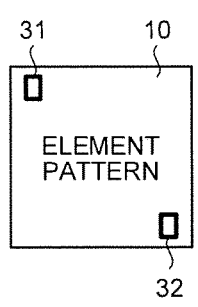
FIGS. 4A and 4B are top views showing another example of the placement of compound semiconductor chips according to the first embodiment.
Figure 4B:
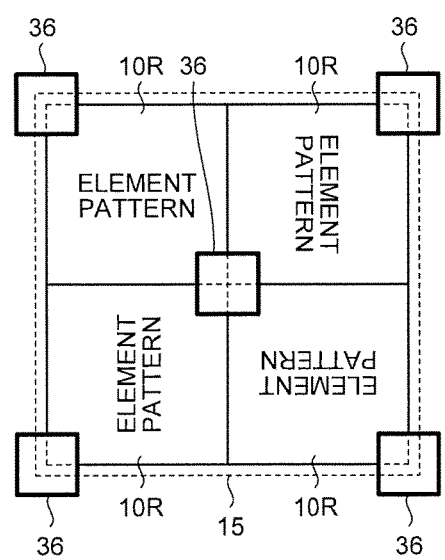
Figure 5A:
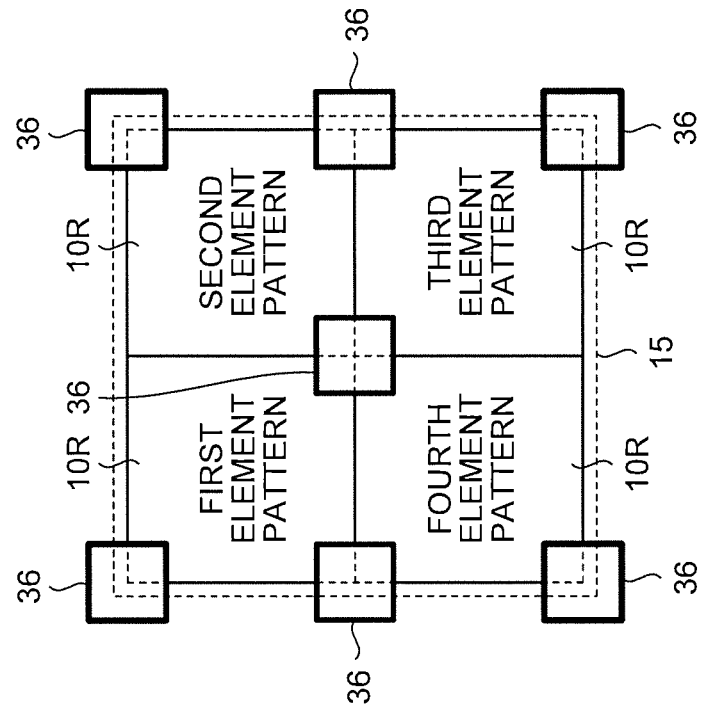
FIGS. 5A and 5B are top views showing another example of the placement of compound semiconductor chips according to the first embodiment.
Figure 5B:
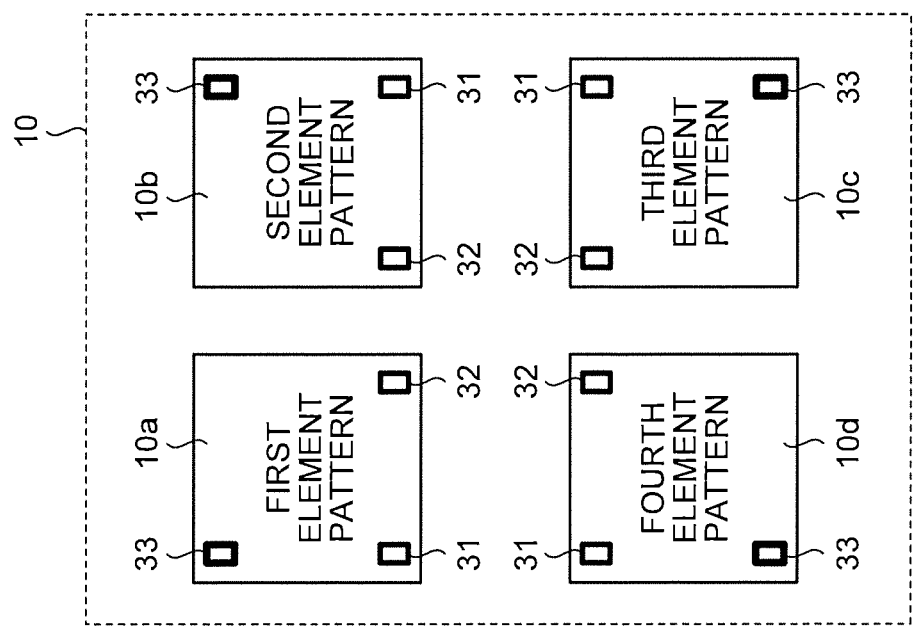
Figure 6A:
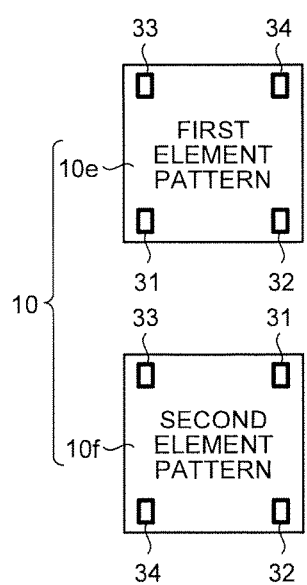
FIGS. 6A and 6B are top views showing another example of the placement of compound semiconductor chips according to the first embodiment.
Figure 6B:
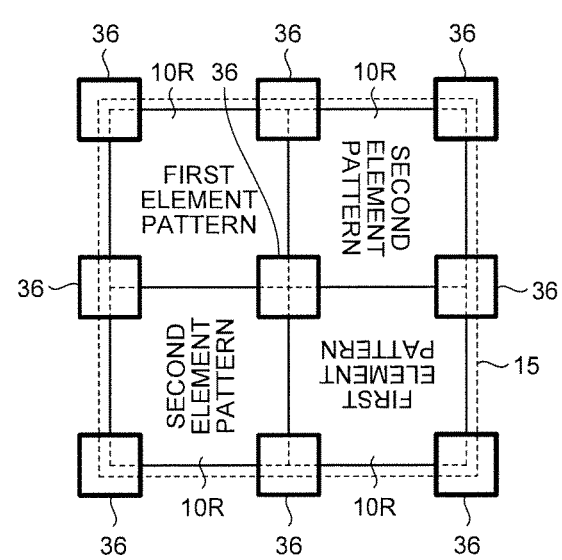

FIGS. 4A to 6B are top views showing other examples of the placement of compound semiconductor chips according to the first embodiment. FIGS. 4A, 5A, and 6A are top view schematically showing examples of the positions of optical function elements in one semiconductor chip, and FIGS. 4B, 5B, and 6B are top view schematically showing examples of the placement state of compound semiconductor chips on chip formation regions of a substrate.

In the example shown in FIG. 4A, a light receiving element 31, which is a first optical function element, is arranged at one corner of a semiconductor chip 10. Further, a light emitting element 32, which is a second optical function element, is arranged at a corner opposite to the corner at which the light receiving element 31 is arranged.

FIG. 4B shows an example of a method of placing compound semiconductor chips 36 to manufacture the semiconductor chip 10 shown in FIG. 4A. As shown in FIG. 4B, in a single chip sharing unit 15, compound semiconductor chips 36 are respectively placed at the four corners and a region including the center. Consequently, one compound semiconductor chip 36 is shared by the four chip formation regions 10R adjacent to each other. In this case, the single chip sharing unit 15 has a four-fold rotational symmetric relation relative to its center. Here, each of the compound semiconductor chips 36 placed at the corners of the chip sharing unit 15 will be processed into light receiving elements 31, and the compound semiconductor chip 36 placed at the region including the center will be processed into light emitting elements 32.

In the example shown in FIG. 5A, semiconductor chips 10a to 10d of four types are included in a semiconductor chip 10. Here, the arrangement direction of a certain element pattern is used as a reference, and the upper left corner, upper right corner, lower right corner, and lower left corner of the semiconductor chip 10 will be referred to as a first corner, second corner, third corner, and fourth corner, respectively. In the semiconductor chip 10a, a light receiving element 31, which is a first optical function element, is arranged at the fourth corner, a light emitting element 32, which is a second optical function element, is arranged at the third corner, and a radio frequency (RF) device element 33, which is a third optical function element, is arranged at the first corner. In the semiconductor chip 10b, the light receiving element 31 is arranged at the third corner, the light emitting element 32 is arranged at the fourth corner, and the RF device element 33 is arranged at the second corner. In the semiconductor chip 10c, the light receiving element 31 is arranged at the second corner, the light emitting element 32 is arranged at the first corner, and the RF device element 33 is arranged at the third corner. In the semiconductor chip 10d, the light receiving element 31 is arranged at the first corner, the light emitting element 32 is arranged at the second corner, and the RF device element 33 is arranged at the fourth corner.

FIG. 5B shows an example of a method of placing compound semiconductor chips 36 to manufacture the semiconductor chip 10 shown in FIG. 5A. As shown in FIG. 5B, in a single chip sharing unit 15, compound semiconductor chips 36 are respectively placed: at regions respectively including the middle parts of a pair of sides; at a region including the center; and at the four corners. In this case also, each of the compound semiconductor chips 36 is shared by the four chip formation regions 10R arranged below. In this way, the element patterns of the respective chip formation regions 10R of the chip sharing unit 15, as well as the respective compound semiconductor chips 36, do not need to have the completely the same arrangement. Here, each of the compound semiconductor chips 36 placed at the regions respectively including the middle parts of a pair of sides of the chip sharing unit 15 will be processed into light receiving elements 31, the compound semiconductor chip 36 placed at the region including the center will be processed into light emitting elements 32, and each of the compound semiconductor chips 36 placed at the corners will be processed into RF device elements 33. Further, in a case where optical function elements of different types are to be processed, the compound semiconductor layers 37 of the compound semiconductor chips 36 placed at the respective positions may have different constitutions.

In the example shown in FIG. 6A, semiconductor chips 10e and 10f of two types are included in a semiconductor chip 10. Optical function elements are respectively arranged at the four corners of each of the semiconductor chips 10e and 10f. Here, the arrangement direction of a certain element pattern is used as a reference, and the upper left corner, upper right corner, lower right corner, and lower left corner of the semiconductor chip 10 will be referred to as a first corner, second corner, third corner, and fourth corner, respectively. In the semiconductor chip 10e, a light receiving element 31, which is a first optical function element, is arranged at the fourth corner, a light emitting element 32, which is a second optical function element, is arranged at the third corner, an RF device element 33, which is a third optical function element, is arranged at the first corner, and a sensor element 34, which is a fourth optical function element, is arranged at the second corner. In the semiconductor chip 10f, the light receiving element 31, which is a first optical function element, is arranged at the second corner, the light emitting element 32, which is a second optical function element, is arranged at the third corner, the RF device element 33, which is a third optical function element, is arranged at the first corner, and the sensor element 34, which is a fourth optical function element, is arranged at the fourth corner.

FIG. 6B shows an example of a method of placing compound semiconductor chips 36 to manufacture the semiconductor chip 10 shown in FIG. 6A. As shown in FIG. 6B, in a single chip sharing unit 15, compound semiconductor chips 36 are respectively placed: at regions respectively including the middle parts of a pair of sides; at a region including the center; at the four corners; and at regions respectively including the middle parts of the other pair of sides. In this case also, each of the compound semiconductor chips 36 is shared by the four chip formation regions 10R arranged below. Here, each of the compound semiconductor chips 36 placed at the regions respectively including the middle parts of a pair of sides of the chip sharing unit 15 will be processed into light receiving elements 31, the compound semiconductor chip 36 placed at the region including the center will be processed into light emitting elements 32, each of the compound semiconductor chips 36 placed at the corners will be processed into RF device elements 33, and each of the compound semiconductor chips 36 placed at the regions respectively including the middle parts of the other pair of sides will be processed into sensor elements 34. Further, in a case where optical function elements of different types are to be processed, the compound semiconductor layers 37 of the compound semiconductor chips 36 placed at the respective positions may have different constitutions.

In the case of FIGS. 4A to 6B also, as described above, no function block having a predetermined function is present in a region opposite to that side where the function block having a large heat release value is arranged with respect to the arrangement position of each of the optical function element 31 to 34.

According to the first embodiment, the optical function element 30 is arranged on the first structure 20 on the substrate 11. The optical function element 30 is arranged such that no function block having a predetermined function is present in a region opposite to that side where the function block having a large heat release value is arranged with respect to the arrangement position of the optical function element 30. Consequently, it is possible to suppress the thermal influence applied to the optical function element 30 from the function block having a large heat release value.

Further, according to the first embodiment, each of the compound semiconductor chips 36 is placed at the corner part shared by four chip formation regions 10R adjacent to each other, and then the compound semiconductor chip 36 is processed so that optical function elements 30 can be respectively included in the chip formation regions 10R. For example, as explained in the example described above, it is difficult to place a compound semiconductor chip 36 having a size of 0.5 mm square or less on the substrate 11 with high precision. However, it is possible to place a compound semiconductor chip 36 having a size of 1 mm square or more on the substrate 11 with high precision. Then, the compound semiconductor chip 36 thus placed is divided to correspond to adjacent chip formation regions 10R, and thereby each of the optical function elements 30 derived from the compound semiconductor chip 36 can have a substantially small size. Accordingly, it is possible to make effective use of the compound semiconductor chip 36, as compared with a case where one compound semiconductor chip 36 is placed on one chip formation region 10R.

Further, since one compound semiconductor chip 36 is placed on four chip formation regions 10R, it is possible to improve the productivity about placement of the compound semiconductor chip 36, as compared with a case where one compound semiconductor chip 36 is placed on one chip formation region 10R.

Second Embodiment

In the first embodiment, an explanation has been given to a case where a compound semiconductor chip is placed at the corner part shared by four chip formation regions adjacent to each other. In the second embodiment, an explanation will be given to a case where a compound semiconductor chip is placed at the side line shared by two chip formation regions adjacent to each other.

Figure 7A:
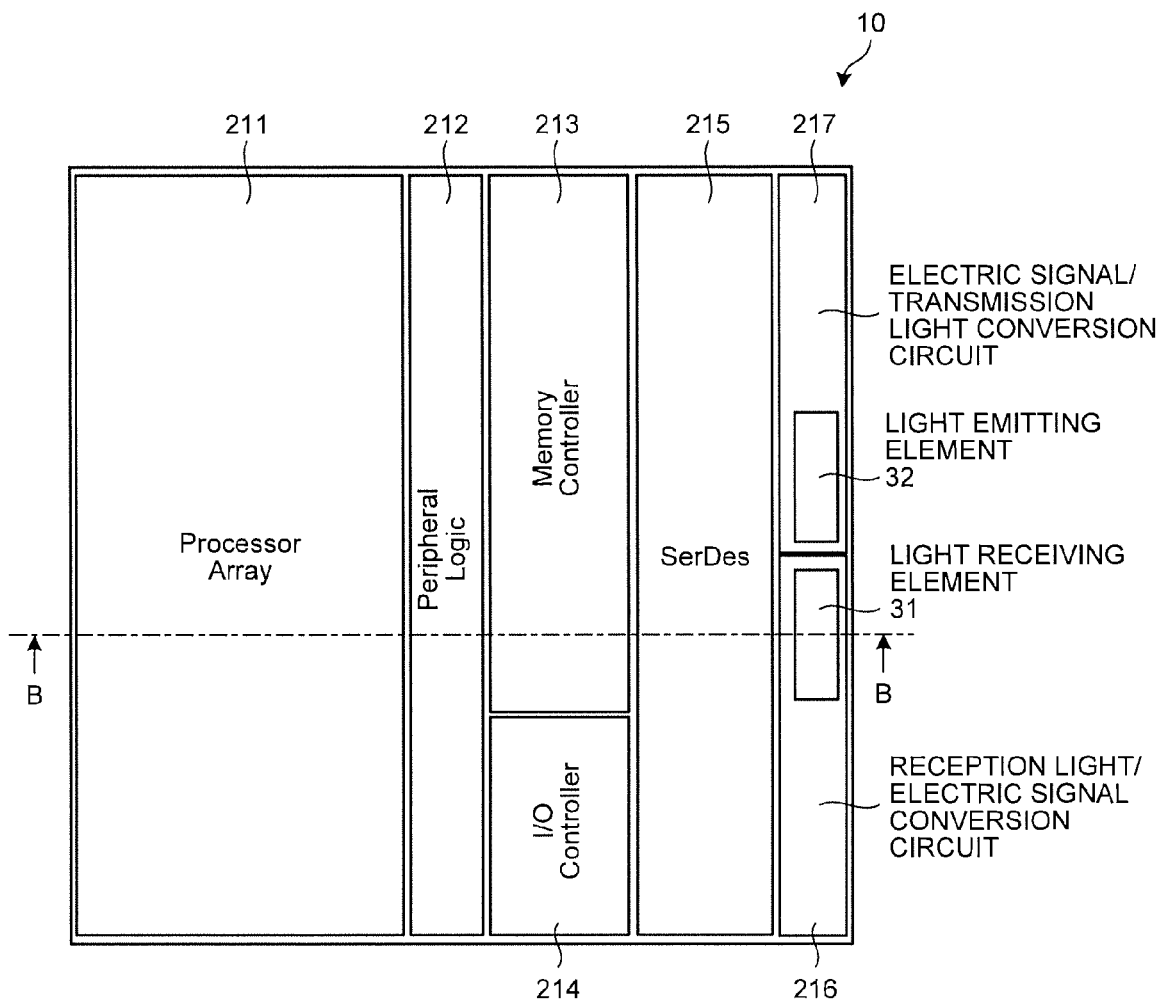
FIGS. 7A and 7B are views schematically showing a structural example of a semiconductor device according to a second embodiment.
Figure 7B:
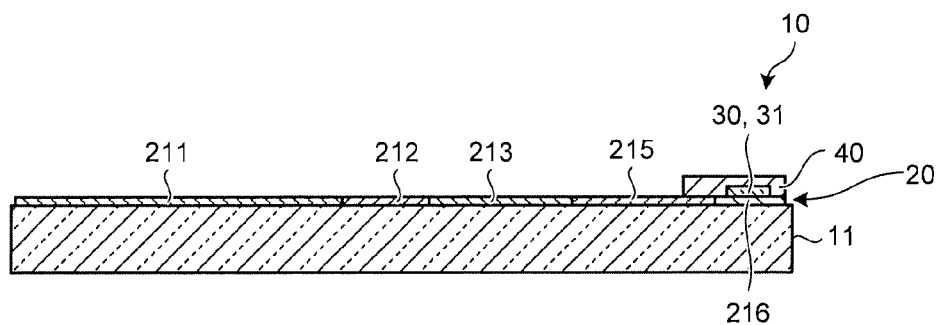

FIGS. 7A and 7B are views schematically showing a structural example of a semiconductor device according to the second embodiment. FIG. 7A is a top view, and FIG. 7B is a sectional view taken along a line B-B of FIG. 7A. This semiconductor device formed of a semiconductor chip 10 has a configuration in which a first structure 20, optical function elements 30, and second structures 40 are arranged on a substrate 11 having a square shape, as in the first embodiment.

In the example shown in FIG. 7A, the function blocks arranged here are a processor array 211, a peripheral circuit 212, a memory controller 213, an I/O controller 214, a SerDes 215, a reception light/electric signal conversion circuit 216, and an electric signal/transmission light conversion circuit 217. The reception light/electric signal conversion circuit 216 and the electric signal/transmission light conversion circuit 217 are arranged along one side of the square substrate 11.

Further, the optical function elements 30 are bonded on the reception light/electric signal conversion circuit 216 and the electric signal/transmission light conversion circuit 217.

Specifically, a light receiving element 31 is bonded on the reception light/electric signal conversion circuit 216, and a light emitting element 32 is formed on the electric signal/transmission light conversion circuit 217. The light emitting element 32 may be exemplified by a laser diode or the like. The optical function element 30 is made of a group III-V compound semiconductor, such as InP, GaAs, GaP, or InAs. The optical function element 30 is bonded onto the first structure 20 by means of oxide film bonding or adhesive bonding.

In this respect, in the first embodiment, the optical function element 30 is arranged at a corner of the square substrate 11, but, in the second embodiment, the optical function element 30 is arranged at a peripheral position of the substrate 11 other than the corners, i.e., it is arranged along a side of the substrate 11. Further, the optical function element 30 is arranged at a position distant from the processor array 211, which is a function block having a large heat release value in operation.

In the second embodiment also, the optical function element 30 is arranged such that no function block having a predetermined function is present in a region opposite to that side of the arrangement position where the function block having a large heat release value is arranged with respect to the arrangement position of the optical function element 30, i.e., in a region outside the optical function element 30. In other words, no function block is arranged between the optical function element 30 and the side closest to the optical function element 30. However, a device element, such as a wiring line, which does not have its own function may be arranged between the optical function element 30 and the side closest to the optical function element 30. The constituent elements corresponding to those of the first embodiment are denoted by the same reference symbols, and their description will be omitted.

Next, an explanation will be given of a method of manufacturing a semiconductor device having such a structure. FIGS. 8A and 8B are top views showing part of the sequence of a method of manufacturing a semiconductor device according to the second embodiment. This method of manufacturing a semiconductor device is similar to that described in the first embodiment. However, when element patterns are formed, two chip formation regions 10R sharing one side line are treated as one chip sharing unit 15 to form element patterns, as shown in FIG. 8A.

In the single chip sharing unit 15, the chip formation regions 10R are arranged to be two-fold rotational symmetric. Specifically, the element pattern arrangements of the respective chip formation regions 10R rotated by 180° about the center of the chip sharing unit 15 overlap with the element pattern arrangements of the respective chip formation regions 10R not rotated.

As shown in FIG. 8A, an X-axis and a Y-axis are defined on the substrate 11. It is assumed that, in the single chip sharing unit 15, the region arranged on the X-axis negative side is a first chip formation region 10R-1, and the region arranged on the X-axis positive side is a second chip formation region 10R-2. On this assumption, the first chip formation region 10R-1 is the same as the second chip formation region 10R-2 rotated by 180°.

In order to form the element patterns in a layer of these chip formation regions 10R, a mask (reticle) of only one type is required. In this case, when a light exposure process is performed, the mask or substrate 11 is rotated accordingly. Alternatively, masks of two types may be prepared such that they have patterns the same in shape and different in orientation by 180°, or a mask of one type may be prepared such that it can be used to perform light exposure to the entire single chip sharing unit 15 at a time.

When the compound semiconductor chips 36 are bonded onto the substrate 11, each of the chips 36 is bonded at or near the middle of the shared side line in each of the chip sharing units 15, as shown in FIG. 8B. Consequently, one compound semiconductor chip 36 is shared by the two chip formation regions 10R-1 and 10R-2. In this respect, as compared with a case where a compound semiconductor chip 36 having a size of, for example, 0.5 mm square or less is positioned and placed onto each of the chip formation regions 10R, a compound semiconductor chip 36 having a size of 1 mm square can be placed at a predetermined position with high precision. Further, after one compound semiconductor chip 36 is placed at a position straddling the chip formation regions 10R, the compound semiconductor chip 36 is divided to correspond to the respective chip formation regions 10R, and thereby it is possible to make effective use of the compound semiconductor chip 36.

Here, the other steps of the manufacturing method are the same as those described in the first embodiment, and so their description will be omitted.

According to the second embodiment, there is provided an effect the same as that explained in the first embodiment. Further, in the second embodiment, when element patterns are formed onto the substrate 11, the element patterns need to be formed only in two directions. Accordingly, as compared with the first embodiment in which the element patterns need to be formed in four directions, it is possible to suppress deterioration of the throughput in manufacturing the semiconductor device.

In the explanation described above, the optical function elements 30 are bonded onto the first structures 20 on the substrate 11, but the bonding object is not limited to the optical function elements 30. As the bonding object, a group III-V compound semiconductor element, such as a ultra high speed transistor element configured to operate at a frequency near terahertz, a sensor element, or an actuator element, which is made of a group III-V compound semiconductor, may be used. Further, in the explanation described above, a case where the first structures 20 includes the reception light/electric signal conversion circuit 207 and 216, and the electric signal/transmission light conversion circuit 208 and 217 and the optical function element 30 includes the light receiving element 31 and the light emitting element 32 has been described. However, the first structure 20 may include only the reception light/electric signal conversion circuit 207 and 216 and the optical function element 30 may include only the light receiving element 31, or the first structure 20 may include only the electric signal/transmission light conversion circuit 208 and 217 and the optical function element 30 may include only the light emitting element 32.

Further, in the explanation described above, the semiconductor chip 10, the chip formation region 10R, and the compound semiconductor chip 36 are exemplified with a square shape, but they may have a rectangular shape or another shape.

[Note 1]

A method of manufacturing a semiconductor device, the method comprising:

bonding a compound semiconductor layer to a position straddling a plurality of chip formation regions arranged on a substrate, one of the chip formation regions having a first size, the compound semiconductor layer having a second size smaller than the first size;

processing the compound semiconductor layer to provide compound semiconductor elements on the chip formation regions; and dividing the substrate to correspond to the chip formation regions.

[Note 2]

The method of manufacturing a semiconductor device according to note 1, wherein the substrate is formed of a silicon substrate.

[Note 3]

The method of manufacturing a semiconductor device according to note 1, wherein an element pattern is formed on one of the chip formation regions having the first size on the substrate.

[Note 4]

The method of manufacturing a semiconductor device according to note 1, wherein the chip formation region has a rectangular shape, and in the bonding of the compound semiconductor layer, a first compound semiconductor layer is bonded to a region including a center of a chip sharing unit, the chip sharing unit being composed of four chip formation regions.

[Note 5]

The method of manufacturing a semiconductor device according to note 4, wherein, in the bonding of the compound semiconductor layer, second compound semiconductor layers are further bonded to four corners of the chip sharing unit.

[Note 6]

The method of manufacturing a semiconductor device according to note 5, wherein, in the bonding of the compound semiconductor layer, third compound semiconductor layers are further bonded to regions including middle parts of a pair of opposite sides of the chip sharing unit.

[Note 7]

The method of manufacturing a semiconductor device according to note 6, wherein, in the bonding of the compound semiconductor layer, the chip sharing unit is composed of the chip formation regions of four types that have different element patterns.

[Note 8]

The method of manufacturing a semiconductor device according to note 6, wherein, in the bonding of the compound semiconductor layer, fourth compound semiconductor layers are further bonded to regions including middle parts of a pair of other opposite sides of the chip sharing unit.

[Note 9]

The method of manufacturing a semiconductor device according to note 8, wherein, in the bonding of the compound semiconductor layer, the chip sharing unit is composed of the chip formation regions of two types that have different element patterns, and the chip formation regions are arranged such that the chip sharing unit is two-fold rotational symmetric.

[Note 10]

The method of manufacturing a semiconductor device according to note 1, wherein the chip formation region has a rectangular shape, and in the bonding of the compound semiconductor layer, the compound semiconductor layer is placed at a region including a center of a chip sharing unit, the chip sharing unit being composed of two chip formation regions.

[Note 11]

The method of manufacturing a semiconductor device according to note 10, wherein, in the bonding of the compound semiconductor layer, the chip sharing unit is composed of the chip formation regions of one type, and the chip formation regions are arranged such that the chip sharing unit is two-fold rotational symmetric.

[Note 12]

The method of manufacturing a semiconductor device according to note 1, wherein, in the bonding of the compound semiconductor layer, the substrate formed with an element pattern and the compound semiconductor layer are boned to one another via an adhesive.

[Note 13]

The method of manufacturing a semiconductor device according to note 1, wherein the bonding of the compound semiconductor layer includes planarizing an uppermost surface of the substrate, terminating a planarized surface of the substrate and a surface of the compound semiconductor layer with a hydroxyl group, temporarily bonding the compound semiconductor layer to the planarized surface of the substrate, and finally bonding the substrate and the compound semiconductor layer to one another by heating.

[Note 14]

The method of manufacturing a semiconductor device according to note 1, wherein, in the bonding of the compound semiconductor layer, a compound semiconductor chip including the compound semiconductor layer formed on a compound semiconductor substrate is bonded to the chip formation regions.

[Note 15]

A semiconductor device comprising:

a substrate;

a first structure arranged on the substrate, the first structure including a function block that includes an element pattern and has a predetermined function; and a compound semiconductor element directly bonded to the first structure, wherein no other function block is arranged outside an arrangement position of the compound semiconductor element.

[Note 16]

The semiconductor device according to note 15, wherein the substrate has a rectangular shape, and the compound semiconductor element is arranged at a position most distant from a center of the substrate.

[Note 17]

The semiconductor device according to note 15, wherein a plurality of compound semiconductor elements are arranged at the first structure.

[Note 18]

The semiconductor device according to note 15, wherein the first structure includes at least one of a reception light/electric signal conversion circuit and an electric signal/transmission light conversion circuit as the function block, and the compound semiconductor element includes at least one of a light receiving element and a light emitting element, the light receiving element being bonded to the reception light/electric signal conversion circuit in the case where the first structure includes the reception light/electric signal conversion circuit, the light emitting element being bonded to the electric signal/transmission light conversion circuit in the case where the first structure includes the electric signal/transmission light conversion circuit.

[Note 19]

The semiconductor device according to note 15, wherein the substrate is formed of a silicon substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
    bonding a compound semiconductor layer to a position straddling a plurality of chip formation regions arranged on a substrate, one of the chip formation regions having a first size, the compound semiconductor layer having a second size smaller than the first size;
    processing the compound semiconductor layer to provide compound semiconductor elements on the chip formation regions; and
    dividing the substrate to correspond to the chip formation regions.

2. The method of manufacturing a semiconductor device according to claim 1, wherein the substrate is formed of a silicon substrate.

3. The method of manufacturing a semiconductor device according to claim 1, wherein an element pattern is formed on one of the chip formation regions having the first size on the substrate.

4. The method of manufacturing a semiconductor device according to claim 1, wherein
    the chip formation region has a rectangular shape, and
    in the bonding of the compound semiconductor layer, a first compound semiconductor layer is bonded to a region including a center of a chip sharing unit, the chip sharing unit being composed of four chip formation regions.

5. The method of manufacturing a semiconductor device according to claim 4, wherein,
    in the bonding of the compound semiconductor layer,
    the chip sharing unit is composed of the chip formation regions of one type, and
        the chip formation regions are arranged such that the chip sharing unit is four-fold rotational symmetric.

6. The method of manufacturing a semiconductor device according to claim 4, wherein, in the bonding of the compound semiconductor layer, second compound semiconductor layers are further bonded to four corners of the chip sharing unit.

7. The method of manufacturing a semiconductor device according to claim 6, wherein, in the bonding of the compound semiconductor layer, third compound semiconductor layers are further bonded to regions including middle parts of a pair of opposite sides of the chip sharing unit.

8. The method of manufacturing a semiconductor device according to claim 7, wherein, in the bonding of the compound semiconductor layer, the chip sharing unit is composed of the chip formation regions of four types that have different element patterns.

9. The method of manufacturing a semiconductor device according to claim 7, wherein, in the bonding of the compound semiconductor layer, fourth compound semiconductor layers are further bonded to regions including middle parts of a pair of other opposite sides of the chip sharing unit.

10. The method of manufacturing a semiconductor device according to claim 9, wherein, in the bonding of the compound semiconductor layer,
    the chip sharing unit is composed of the chip formation regions of two types that have different element patterns, and
    the chip formation regions are arranged such that the chip sharing unit is two-fold rotational symmetric.

11. The method of manufacturing a semiconductor device according to claim 1, wherein
    the chip formation region has a rectangular shape, and
    in the bonding of the compound semiconductor layer, the compound semiconductor layer is placed at a region including a center of a chip sharing unit, the chip sharing unit being composed of two chip formation regions.

12. The method of manufacturing a semiconductor device according to claim 11, wherein,
    in the bonding of the compound semiconductor layer,
        the chip sharing unit is composed of the chip formation regions of one type, and
        the chip formation regions are arranged such that the chip sharing unit is two-fold rotational symmetric.

13. The method of manufacturing a semiconductor device according to claim 1, wherein, in the bonding of the compound semiconductor layer, the substrate formed with an element pattern and the compound semiconductor layer are boned to one another via an adhesive.

14. The method of manufacturing a semiconductor device according to claim 1, wherein the bonding of the compound semiconductor layer includes
    planarizing an uppermost surface of the substrate,
    terminating a planarized surface of the substrate and a surface of the compound semiconductor layer with a hydroxyl group,
    temporarily bonding the compound semiconductor layer to the planarized surface of the substrate, and
    finally bonding the substrate and the compound semiconductor layer to one another by heating.

15. The method of manufacturing a semiconductor device according to claim 1, wherein, in the bonding of the compound semiconductor layer, a compound semiconductor chip including the compound semiconductor layer formed on a compound semiconductor substrate is bonded to the chip formation regions.

* * * * *